US006999009B2

(12) United States Patent
Monney

(10) Patent No.: US 6,999,009 B2
(45) Date of Patent: Feb. 14, 2006

(54) SENSING KEYS FOR KEYBOARD

(75) Inventor: Patrick Monney, Mex (CH)

(73) Assignee: Logitech Europe S.A., Romanel-sur Morges (CH)

( * ) Notice: Subject to any disclaimer, the term of this patent is extended or adjusted under 35 U.S.C. 154(b) by 611 days.

(21) Appl. No.: 10/229,798

(22) Filed: Aug. 27, 2002

(65) Prior Publication Data

US 2003/0053280 A1 Mar. 20, 2003

Related U.S. Application Data

(60) Provisional application No. 60/316,749, filed on Aug. 31, 2001.

(51) Int. Cl.
*H03K 17/94* (2006.01)
*H03M 11/00* (2006.01)

(52) U.S. Cl. ............................ 341/34; 341/21; 341/22; 341/26

(58) Field of Classification Search ............ 341/21–26, 341/33–34
See application file for complete search history.

(56) References Cited

U.S. PATENT DOCUMENTS 3,617,660 A 11/1971 Krakinowski
3,693,059 A 9/1972 Harris
3,723,673 A 3/1973 Clary et al.
3,911,234 A 10/1975 Kotaka
3,917,917 A 11/1975 Murata
3,921,167 A 11/1975 Fox
3,969,595 A 7/1976 Johnson
4,028,509 A 6/1977 Zurcher
4,044,642 A 8/1977 Pearlman et al.
4,362,911 A 12/1982 Sears et al.
4,425,484 A 1/1984 Fukukura
4,453,198 A 6/1984 Bush et al.
4,471,177 A 9/1984 Doughty
4,472,758 A 9/1984 Goto et al.
4,665,788 A * 5/1987 Tripp et al. .................. 84/658
4,852,443 A 8/1989 Duncan et al.
4,876,461 A 10/1989 Gratke
4,920,342 A 4/1990 Gratke
4,920,343 A 4/1990 Schwartz
5,515,044 A * 5/1996 Glatt ......................... 341/22
5,717,176 A 2/1998 Dahlstrom
5,828,363 A 10/1998 Yaniger et al.

* cited by examiner

*Primary Examiner*—Michael Horabik
*Assistant Examiner*—Kimberly Jenkins
(74) *Attorney, Agent, or Firm*—Townsend and Townsend and Crew LLP

(57) ABSTRACT

A key sensing device comprises a first conductive contact and a second conductive contact spaced from one another by a low-force spacer element which includes a low-force aperture disposed between the first conductive contact and the second conductive contact. A third conductive contact and a fourth conductive contact are spaced from one another by a high-force spacer element which includes a high-force aperture disposed therebetween. The low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture. The low-force aperture is larger in size than the high-force aperture.

23 Claims, 2 Drawing Sheets

SENSING KEYS FOR KEYBOARD

CROSS-REFERENCES TO RELATED APPLICATIONS

This application is based on and claims the benefit of U.S. Provisional Patent Application No. 60/316,749, filed Aug. 31, 2001, the entire disclosure of which is incorporated herein by reference.

BACKGROUND OF THE INVENTION

The present invention relates to keyboards and, more particularly, to a computer keyboard having sensing keys that sense the force applied on the keys and produce a change in function or application based on the sensed force applied thereon.

SUMMARY OF THE INVENTION

Embodiments of the present invention are directed to a computer keyboard having a key sensing device that provides two or more levels of sensing by generating electrical signals depending on the force applied on the keys. The different levels of key sensing can be used to provide different functions, for instance, in a software application. This key sensing functionality can be provided on all or only some of the keys of the keyboard. In one example, the key sensing feature is provided on the four scrolling keys to provide different scrolling speeds. When the force applied on a scroll key is small or normal, the scrolling occurs at a normal speed. When the force applied on the scroll key is large, the scrolling occurs at a higher speed.

In accordance with an aspect of the present invention, a key sensing device for a keyboard key comprises a first conductive contact and a second conductive contact spaced from one another by a low-force spacer element, which includes a low-force aperture disposed between the first conductive contact and the second conductive contact. A third conductive contact and a fourth conductive contact are spaced from one another by a high-force spacer element which includes a high-force aperture disposed between the third conductive contact and the fourth conductive contact. The low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture. The low-force aperture is larger in size than the high-force aperture so that a lower force is required to cause contact between the first conductive contact and the second conductive contact than to cause contact between the third conductive contact and the fourth conductive contact.

The low-force aperture is typically at least about 10% larger, desirably at least about 25% larger, and more desirably at least about 50% larger, in size than the high-force aperture.

In some embodiments, the first conductive contact is provided on a first layer, the second conductive contact is provided on a second layer, and the low-force spacer element comprises a low-force spacer layer disposed between the first layer and the second layer. At least one of the first layer and the second layer is flexible. In specific embodiments, the first layer, the second layer, and the low-force spacer layer each comprise a flexible membrane.

In some embodiments, the third conductive contact is provided on a third layer, the fourth conductive contact is provided on a fourth layer, and the high-force spacer element comprises a high-force spacer layer disposed between the third layer and the fourth layer. At least one of the third layer and the fourth layer is flexible. In specific embodiments, the third layer, the fourth layer, and the high-force spacer layer each comprise a flexible membrane.

In another embodiment, a double-sided layer replaces the second layer and the third layer. The second conductive contact is provided on one side of the double-sided layer and the third conductive contact is provided on another side of the double-sided layer opposite from the second conductive contact.

In accordance with another aspect of the present invention, a key sensing device for keyboard keys includes a first layer comprising at least one first conductive contact, and a second layer comprising at least one second conductive contact. A low-force spacer layer is disposed between the first layer and the second layer to space the at least one first conductive contact from the at least one second conductive contact. The low-force spacer layer includes at least one low-force aperture disposed between one of the at least one first conductive contact and one of the at least one second conductive contact. The key sensing device further includes a third layer comprising at least one third conductive contact, and a fourth layer comprising at least one fourth conductive contact. A high-force spacer layer is disposed between the third layer and the fourth layer to space the at least one third conductive contact from the at least one fourth conductive contact. The high-force spacer layer includes at least one high-force aperture disposed between one of the at least one third conductive contact and one of the at least one fourth conductive contact. The at least one low-force aperture and the at least one high-force aperture are configured to be aligned with a keyboard key. The at least one low-force aperture is larger in size than the at least one high-force aperture.

In some embodiments, the first layer is disposed on top of the second layer which is disposed on top of the third layer, which is disposed on top of the fourth layer. The first layer, the second layer, and third layer, and the fourth layer each comprise a flexible membrane.

In accordance with another aspect of the invention, a key sensing device for keyboard keys includes a first layer comprising at least one first conductive contact, and a second layer comprising at least one second conductive contact disposed on one side and at least one third conductive contact disposed on another side opposite from the at least one second conductive contact. A low-force spacer layer is disposed between the first layer and the second layer to space the at least one first conductive contact from the at least one second conductive contact. The low-force spacer layer includes at least one low-force aperture disposed between one of the at least one first conductive contact and one of the at least one second conductive contact. A third layer comprises at least one fourth conductive contact. A high-force spacer layer is disposed between the second layer and the third layer to space the at least one third conductive contact from the at least one fourth conductive contact. The high-force spacer layer includes at least one high-force aperture disposed between one of the at least one third conductive contact and one of the at least one fourth conductive contact. The at least one low-force aperture and the at least one high-force aperture are configured to be aligned with a keyboard key. The at least one low-force aperture is larger in size than the at least one high-force aperture.

In accordance with another aspect of the present invention, a key sensing device for a keyboard key comprises a first conductive contact and a second conductive contact spaced from one another by a low-force spacer element which includes a low-force aperture disposed between the first conductive contact and the second conductive contact. A third conductive contact and a fourth conductive contact are spaced from one another by a high-force spacer element which includes a high-force aperture disposed between the third conductive contact and the fourth conductive contact. The low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture. The low-force spacer with the low-force aperture and the high-force spacer with the high-force aperture are configured so that a lower force is required to cause contact between the first conductive contact and the second conductive contact than to cause contact between the third conductive contact and the fourth conductive contact.

In some embodiments, the low-force aperture is larger in size than the high-force aperture so that a lower force is required to cause contact between the first conductive contact and the second conductive contact than to cause contact between the third conductive contact and the fourth conductive contact. The first conductive contact is provided on a first layer, the second conductive contact is provided on a second layer, and the low-force spacer element comprises a low-force spacer layer disposed between the first layer and the second layer. At least one of the first layer and the second layer is flexible. The third conductive contact is provided on a third layer, the fourth conductive contact is provided on a fourth layer, and the high-force spacer element comprises a high-force spacer layer disposed between the third layer and the fourth layer. At least one of the third layer and the fourth layer is flexible.

In other embodiments, the first conductive contact is provided on a first layer, the second conductive contact is provided on one side of a second layer, and the low-force spacer element comprises a low-force spacer layer disposed between the first layer and the second layer. At least one of the first layer and the second layer is flexible. The third conductive contact is provided on another side of the second layer opposite from the second conductive contact, the fourth conductive contact is provided on a third layer, and the high-force spacer element comprises a high-force spacer layer disposed between the second layer and the third layer. At least one of the second layer and the third layer is flexible.

In accordance with another aspect of the present invention, a key sensing device for a keyboard key comprises a first conductive contact and a second conductive contact spaced from one another by a spacer element which includes an aperture disposed between the first conductive contact and the second conductive contact. A force sensor is configured to generate a signal corresponding to a force applied thereon. The aperture and the force sensor are configured to be aligned with a keyboard key so that a pressing of the keyboard key with a sufficient force causes contact between the first conductive contact and the second conductive contact through the aperture and the pressing of the keyboard key with different forces produces different signals in the force sensor.

In some embodiments, the force sensor comprises a force-sensing resistor. The force sensor may comprise a third conductive contact spaced from a metal plate by an insulative layer, and the force sensor generates an output corresponding to a capacitance between the third conductive contact and the metal plate. A protrusion may be disposed below the keyboard key, and collapses under a sufficiently high force applied thereon via the keyboard key. The protrusion may be formed on a metal plate disposed below the first and second conductive contacts and the force sensor.

DESCRIPTION OF THE SPECIFIC EMBODIMENTS

Figure 1:
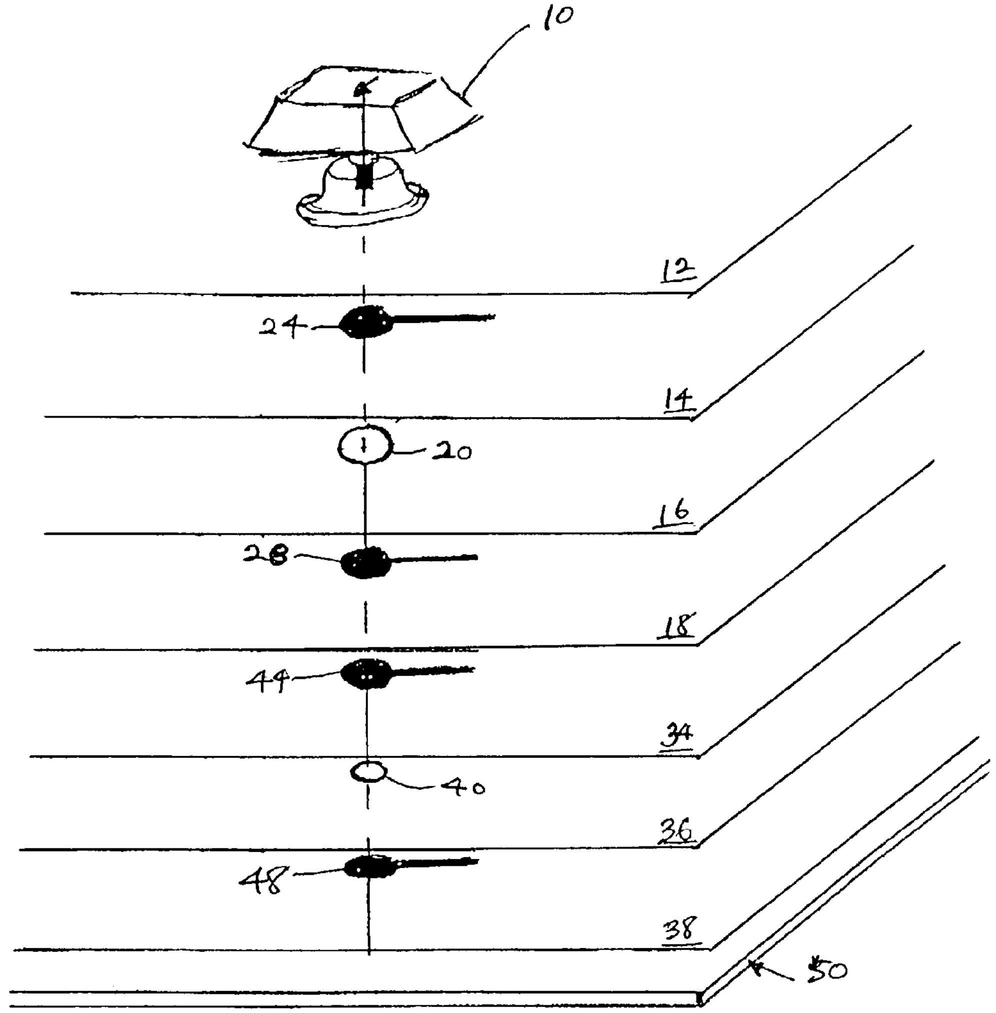
FIG. 1 is a perspective schematic view of the key sensing device according to an embodiment of the present invention.

FIG. 1 shows one embodiment of a key sensing device for a key 10. A conventional keyboard includes four layers 12, 14, 16, 18. The top layer 12 is a rubber domes sheet. The layers 14, 16, 18 form a group of membrane layers, with the middle layer 16 as a spacer layer having holes formed under the keys. FIG. 1 shows a low-force aperture or hole 20 under the key 10. Disposed on opposite sides of the low-force aperture 20 are a conductive contact 24 on the layer 14 and a conductive contact 28 on the layer 18. A signal is generated when the conductive contacts 24, 28 on the layers 14, 18 make electrical contact through the low-force aperture 20 upon pressing of the key 10 disposed above the aperture 20. One or both of the layers 14, 18 are flexible. The layers 14, 16, 18 are typically nonconductive flexible membrane layers.

In FIG. 1, a second group of three membrane layers 34, 36, 38 are added. The middle layer 36 is a spacer layer between the layers 34, 38, and includes holes formed under the keys. FIG. 1 shows a high-force aperture or hole 40 under the key 10. Disposed on opposite sides of the high-force aperture 40 are a conductive contact 44 on the layer 34 and a conductive contact 48 on the layer 38. A signal is generated when the conductive contacts 44, 48 on the layers 34, 38 make electrical contact through the high-force aperture 40 upon pressing of the key 10 disposed above the aperture 40. One or both of the layers 34, 38 are flexible. The layers 34, 36, 38 are typically nonconductive flexible membrane layers. Disposed at the bottom is a plate 50 which is typically a metal plate.

As shown in FIG. 1, the high-force aperture 40 is smaller than the low-force aperture 20, so that a larger force is required to make electrical contact between the conductive contacts 44, 48 of the layers 34, 38 than to make electrical contact between the conductive contacts 24, 28 of the layers 14, 18. This configuration provides two levels of sensing: (1) low or normal force with contact between the conductive contacts 24, 28 through the low-force aperture 20, and (2) high force with contact between the conductive contacts 44, 48 through the high-force aperture 40. The low-force aperture 20 is typically at least about 10% larger in size than the high-force aperture 40, and is desirably about 25% larger, and more desirably about 50% larger in size than the high-force aperture 40. The choice will depend on the desired user's feel to be achieved.

Figure 2:
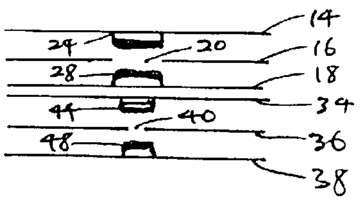
FIG. 2 is an elevational schematic view of the key sensing device of FIG. 1.
Figure 3:
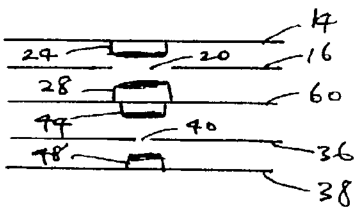
FIG. 3 is an elevational schematic view of the key sensing device according to another embodiment of the present invention.

FIG. 2 shows another schematic view of the key sensing device of FIG. 1. In another embodiment, the layers 18 and 34 may be replaced by a double-sided membrane sheet 60, as shown in FIG. 3. The conductive contacts 28, 44 are provided on opposite sides of the double-sided layer 60.

The embodiments of FIGS. 1–3 employ a low-force aperture 20 in the low-force spacer layer 16 which is larger in size than the high-force aperture 40 in the high-force spacer layer 36 to provide two levels of key sensing. The spacer layers 16, 36 may be configured in different ways to produce the two levels of sensing, for instance, by providing different spacings or different flexibility levels, such that a larger force is required to produce contact between the conductive contacts 44, 48 through the high-force aperture 40 than to produce contact between the conductive contacts 24, 28 through the low-force aperture 20. It is understood that additional layers with conductive contacts spaced by differently sized apertures may be provided to create more than two levels of sensing.

Figure 4:
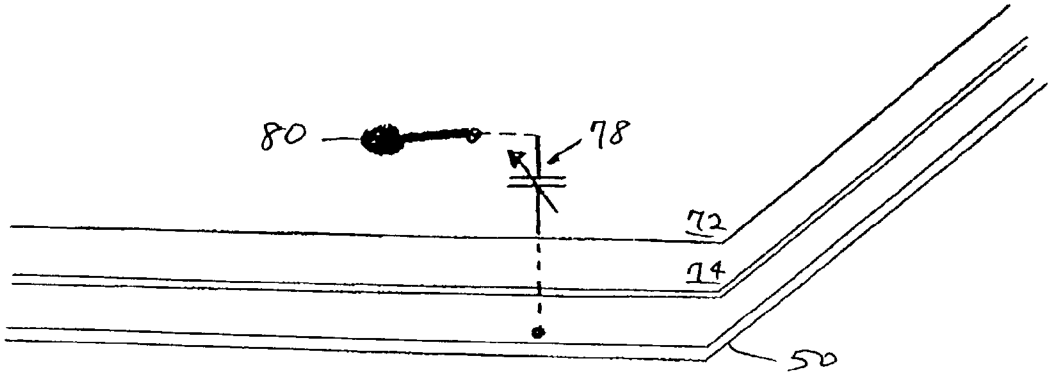
FIG. 4 is a perspective schematic view of the key sensing device incorporating capacitance measurement according to another embodiment of the present invention.

FIG. 4 shows another embodiment of the key sensing device by providing two additional layers 72, 74 below the layers 14, 16, 18 (as seen in FIGS. 1 and 2). The capacitance 78 is measured between the conductive contact 80 of the layer 72 and the metal plate 50 which are spaced by the spacer layer 74. The capacitance 78 is a function of the force applied on the key 10, provided that the spacer layer 74 is a thin, flexible layer.

Figure 5:
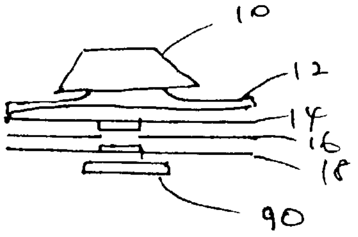
FIG. 5 is an elevational view of the key sensing device incorporating a force-sensing resistor according to another embodiment of the present invention.

FIG. 5 shows another embodiment of the key sensing device by providing below the button 10 a force-sensing resistor 90, which may include a sensor substrate, a semiconductor layer, and conductors. The force-sensing resistor 90 provide multiple levels of sensing by generating different output signals corresponding to the different levels of force applied thereon via the button 10 by the user. Examples of force-sensing resistors 90 may be found in U.S. Pat. No. 5,828,363, which is incorporate herein by reference in it entirety, and http://www.iee.lu/fsr1.htm. The force-sensing resistor 90 may be provided below the three layers 14,16, 18 with conductive contacts 24, 28 spaced by aperture 20, as shown in FIG. 5, or in a space within the three layers 14, 16, 18. To provide the desired levels of sensing, the sensitivity of the force-sensing resistor 90 can be selected and calibrated with respect to the sensitivity of the three layers 14, 16, 18.

Figure 6:
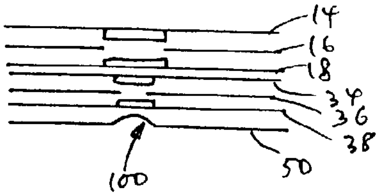
FIG. 6 is an elevational view of the key sensing device incorporating a user feedback mechanism according to another embodiment of the present invention.
Figure 6A:
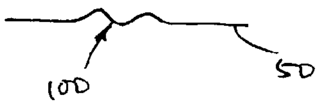
FIG. 6*a* is an elevational view of the metal plate of the key sensing device of FIG. 5 illustrating deformation of a dome-like protrusion.

In FIG. 6, a pancake shaped or dome-like protrusion 100 is formed (e.g., by stamping) or incorporated into the metal plate 50 below the button 10 and layers to provide feedback to the user. Under a low pressure on the button 10 to create contact between the conductive contacts 24, 28 across the aperture 20, the protrusion 100 does not deform. When a high pressure is applied to create contact between the conductive contacts 44, 48 across the aperture 40, the protrusion 90 deforms or collapses (FIG. 6*a*) to provide feedback to the user. The deformation of the protrusion 100 may provide a click to provide audio feedback as well. The protrusion 100 may take on a variety of shape, and a spring may optionally be provided below to support the protrusion 100 until it collapses.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A key sensing device for a keyboard key comprising:

a first conductive contact and a second conductive contact spaced from one another by a low-force spacer element which includes a low-force aperture disposed between the first conductive contact and the second conductive contact; and a third conductive contact and a fourth conductive contact spaced from one another by a high-force spacer element which includes a high-force aperture disposed between the third conductive contact and the fourth conductive contact;

wherein the low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture, and wherein the low-force aperture is larger in size than the high-force aperture so that a lower force is required to cause contact between the first conductive contact and the second conductive contact than to cause contact between the third conductive contact and the fourth conductive contact.

2. The key sensing device of claim 1 wherein the low-force aperture is at least about 10% larger in size than the high-force aperture.

3. The key sensing device of claim 2 wherein the low-force aperture is at least about 25% larger in size than the high-force aperture.

4. The key sensing device of claim 3 wherein the low-force aperture is at least about 50% larger in size than the high-force aperture.

5. The key sensing device of claim 1 wherein the first conductive contact is provided on a first layer, the second conductive contact is provided on a second layer, and the low-force spacer element comprises a low-force spacer layer disposed between the first layer and the second layer, at least one of the first layer and the second layer being flexible.

6. The key sensing device of claim 5 wherein the first layer, the second layer, and the low-force spacer layer each comprise a flexible membrane.

7. The key sensing device of claim 5 wherein the third conductive contact is provided on a third layer, the fourth conductive contact is provided on a fourth layer, and the high-force spacer element comprises a high-force spacer layer disposed between the third layer and the fourth layer, at least one of the third layer and the fourth layer being flexible.

8. The key sensing device of claim 7 wherein the third layer, the fourth layer, and the high-force spacer layer each comprise a flexible membrane.

9. The key sensing device of claim 5 wherein the second conductive contact is provided on one side of the second layer and the third conductive contact is provided on another side of the second layer opposite from the second conductive contact, wherein the fourth conductive contact is provided on a third layer, and the high-force spacer element comprises a high-force spacer layer disposed between the second layer and the third layer, at least one of the second layer and the third layer being flexible.

10. The key sensing device of claim 9 wherein the second layer, the third layer, and the high-force spacer layer each comprise a flexible membrane.

11. A key sensing device for keyboard keys comprising:

a first layer comprising at least one first conductive contact;

a second layer comprising at least one second conductive contact;

a low-force spacer layer disposed between the first layer and the second layer to space the at least one first conductive contact from the at least one second conductive contact, the low-force spacer layer including at least one low-force aperture disposed between one of the at least one first conductive contact and one of the at least one second conductive contact;

a third layer comprising at least one third conductive contact;

a fourth layer comprising at least one fourth conductive contact; and a high-force spacer layer disposed between the third layer and the fourth layer to space the at least one third conductive contact from the at least one fourth conductive contact, the high-force spacer layer including at least one high-force aperture disposed between one of the at least one third conductive contact and one of the at least one fourth conductive contact;

wherein the at least one low-force aperture and the at least one high-force aperture are configured to be aligned with a keyboard key, and wherein the at least one low-force aperture is larger in size than the at least one high-force aperture.

12. The key sensing device of claim 11 wherein the first layer is disposed on top of the second layer which is disposed on top of the third layer, which is disposed on top of the fourth layer.

13. The key sensing device of claim 11 wherein the first layer, the second layer, and third layer, and the fourth layer each comprise a flexible membrane.

14. The key sensing device of claim 11 wherein the low-force aperture is at least about 25% larger in size than the high-force aperture.

15. A key sensing device for keyboard keys comprising:

a first layer comprising at least one first conductive contact;

a second layer comprising at least one second conductive contact disposed on one side and at least one third conductive contact disposed on another side opposite from the at least one second conductive contact;

a low-force spacer layer disposed between the first layer and the second layer to space the at least one first conductive contact from the at least one second conductive contact, the low-force spacer layer including at least one low-force aperture disposed between one of the at least one first conductive contact and one of the at least one second conductive contact;

a third layer comprising at least one fourth conductive contact; and a high-force spacer layer disposed between the second layer and the third layer to space the at least one third conductive contact from the at least one fourth conductive contact, the high-force spacer layer including at least one high-force aperture disposed between one of the at least one third conductive contact and one of the at least one fourth conductive contact;

wherein the at least one low-force aperture and the at least one high-force aperture are configured to be aligned with a keyboard key, and wherein the at least one low-force aperture is larger in size than the at least one high-force aperture.

16. A key sensing device for a keyboard key comprising:

a first conductive contact and a second conductive contact spaced from one another by a low-force spacer element which includes a low-force aperture disposed between the first conductive contact and the second conductive contact; and a third conductive contact and a fourth conductive contact spaced from one another by a high-force spacer element which includes a high-force aperture disposed between the third conductive contact and the fourth conductive contact;

wherein the low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture, and wherein the low-force spacer with the low-force aperture and the high-force spacer with the high-force aperture are configured so that a lower force is required to cause contact between the first conductive contact and the second conductive contact than to cause contact between the third conductive contact and the fourth conductive contact;

wherein the low-force aperture is larger in size than the high-force aperture so that a lower force is required to cause contact between the first conductive contact and the second conductive contact than to cause contact between the third conductive contact and the fourth conductive contact; and wherein the low-force aperture is at least about 25% larger in size than the high-force aperture.

17. The key sensing device of claim 16 wherein the first conductive contact is provided on a first layer, the second conductive contact is provided on a second layer, and the low-force spacer element comprises a low-force spacer layer disposed between the first layer and the second layer, at least one of the first layer and the second layer being flexible; and wherein the third conductive contact is provided on a third layer, the fourth conductive contact is provided on a fourth layer, and the high-force spacer element comprises a high-force spacer layer disposed between the third layer and the fourth layer, at least one of the third layer and the fourth layer being flexible.

18. The key sensing device of claim 16 wherein the first conductive contact is provided on a first layer, the second conductive contact is provided on one side of a second layer, and the low-force spacer element comprises a low-force spacer layer disposed between the first layer and the second layer, at least one of the first layer and the second layer being flexible; and wherein the third conductive contact is provided on another side of the second layer opposite from the second conductive contact, the fourth conductive contact is provided on a third layer, and the high-force spacer element comprises a high-force spacer layer disposed between the second layer and the third layer, at least one of the second layer and the third layer being flexible.

19. A key sensing device for a keyboard key comprising:

a first conductive contact and a second conductive contact spaced from one another by a spacer element which includes an aperture disposed between the first conductive contact and the second conductive contact; and a force sensor configured to generate a signal corresponding to a force applied thereon;

wherein the aperture and the force sensor are configured to be aligned with a keyboard key so that a pressing of the keyboard key with a sufficient force causes contact between the first conductive contact and the second conductive contact through the aperture and the pressing of the keyboard key with different forces produces different signals in the force sensor;

wherein the first and second conductive contacts are spaced from one another by a low-force spacer element which includes a low-force aperture disposed between the first conductive contact and the second conductive contact, wherein the force sensor comprises a third conductive contact and a fourth conductive contact spaced from one another by a high-force spacer element which includes a high-force aperture disposed between the third conductive contact and the fourth conductive contact; wherein the low-force aperture and the high-force aperture are configured to be aligned with a keyboard key so that a pressing of the keyboard key with a sufficient force causes contact between the first conductive contact and the second conductive contact through the low-force aperture and contact between the third conductive contact and the fourth conductive contact through the high-force aperture, and wherein the low-force aperture is larger in size than the high-force aperture so that a lower force is required to cause contact between the first conductive contact and the second conductive contact than to cause contact between the third conductive contact and the fourth conductive contact.

20. The key sensing device of claim 19 wherein the force sensor comprises a force-sensing resistor.

21. The key sensing device of claim 19 wherein the force sensor comprises a third conductive contact spaced from a metal plate by an insulative layer, the force sensor generating an output corresponding to a capacitance between the third conductive contact and the metal plate.

22. The key sensing device of claim 19 further comprising a protrusion disposed below the keyboard key, the protrusion collapsing under a sufficiently high force applied thereon via the keyboard key.

23. The key sensing device of claim 22 wherein the protrusion is formed on a metal plate disposed below the first and second conductive contacts and the force sensor.

* * * * *